(12) United States Patent
Gao

(10) Patent No.: US 11,711,910 B2
(45) Date of Patent: Jul. 25, 2023

(54) SERVER RACK WITH LEAK PROTECTION AND DETECTION

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 8 days.

(21) Appl. No.: 17/465,529

(22) Filed: Sep. 2, 2021

(65) Prior Publication Data
US 2023/0061298 A1    Mar. 2, 2023

(51) Int. Cl.
*H05K 7/20* (2006.01)
*G01M 3/16* (2006.01)

(52) U.S. Cl.
CPC ..... *H05K 7/20781* (2013.01); *H05K 7/20509* (2013.01); *G01M 3/16* (2013.01)

(58) Field of Classification Search
CPC .. H05K 7/20781; H05K 7/20509; G01M 3/16
See application file for complete search history.

(56) References Cited

U.S. PATENT DOCUMENTS

2021/0274687 A1* 9/2021 Chen ................. H05K 7/20272

FOREIGN PATENT DOCUMENTS

| CN | 112911905 | * | 6/2021 | ............ H05K 7/208 |
| CN | 111132516 | * | 8/2021 | ......... H05K 7/20336 |

* cited by examiner

*Primary Examiner* — Mukundbhai G Patel
(74) *Attorney, Agent, or Firm* — Womble Bond Dickinson (US) LLP

(57) ABSTRACT

A liquid cooling system can be installed to an information technology (IT) rack. The liquid cooling system can include a cooling assembly that has a cooling chassis and cold plates fixed at a bottom portion of the cooling chassis. Fluid lines are arranged in an interior of the cooling chassis to fluidly connect the cold plates to a supply line and a return line. The cooling chassis includes an outlet port that provides a path for a leaked fluid to flow out of the cooling chassis. The outlet port is inserted into an opening of a detection channel that has one or more fluid sensors within the detection channel. The floor of the cooling chassis may have a shape or other features to assist flow of leaked fluid towards the outlet port to assist in depositing the leaked fluid in the detection channel.

20 Claims, 7 Drawing Sheets

(TOP VIEW)

(SIDE VIEW)

(BACK VIEW)

SERVER RACK WITH LEAK PROTECTION AND DETECTION

FIELD

Embodiments of the present disclosure relate generally to a cooling system design for a server rack. In particular, the cooling system can distribute fluid to and from servers held in the server rack while protecting the servers from potential leaks and detecting such leaks should they occur, with codesign of the server and rack.

BACKGROUND

Information Technology (IT) includes technology such as computers that are accessible through the internet or a local network, which provide storage of, or access to, data, websites, computer programs, algorithms, services, and more. IT equipment such as servers and other electronic devices (e.g., peripheral devices) can be installed in a chassis. These server chassis can then be installed in a server rack, which is also referred to herein as an IT rack. An IT rack can be populated with a plurality of server chassis, each server chassis housing one or more printed circuit board where the electronics devices and integrated circuits are packaged. The server chassis can serve to manage power, thermal requirements, electronic connectivity and wiring, mechanical and structural support, and other considerations of the IT equipment.

One important design in a cooling system is designing the cooling distribution system for distributing cooling fluid. A cooling distribution system may transfer and deliver fluid (e.g., a liquid coolant) between an IT rack and the chassis, and between the chassis and the IT equipment that is mounted on the chassis. Such a system is required to provide high operational and cooling efficiency of the IT equipment, and at the same time, high reliability is desirable. Liquid cooling for high power density electronics has increased in popularity because air cooling can be thermally insufficient in some circumstances. Liquid cooling allows for higher packaging density and increased computing load of electronics, by properly transferring the heat load generated by the electronics and at the same time, providing proper thermal environment.

Liquid cooling systems can be susceptible to fluid leaks, which can damage IT equipment. For example, fluid flows through many components joined together by fluid lines. As the number of connection points increase, so does the likelihood of a leak, given that each connection point poses an increased risk of failure. Manufacturing defect, improper installation, or other factors can result in a fluid leak. Fluid leaks can cause permanent damage to electronics such as, for example, servers, peripherals, power supplies, fans. Fluid leaks can also cause the equipment to malfunction or shut down for maintenance, resulting in unwanted downtime. Thus, an IT rack should be resistant to fluid leaks in a manner that protects the IT equipment.

Further, even if a design is resistant to fluid leaks, given the high cost of some IT equipment, detection of a leak may be beneficial. An IT rack may react and take remedial measures when a leak is detected, to reduce risk. Thus, there is a need for a cooling solution that addresses issues described.

A leak detection sensor may perform in various ways depending on the detection mechanism. A high accurate detection sensor may significantly increase the hardware cost and a low end detection sensor may not detect and identify every leak scenario in an IT rack. Therefore, a proper hardware design for implementing the detection sensor is desirable.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
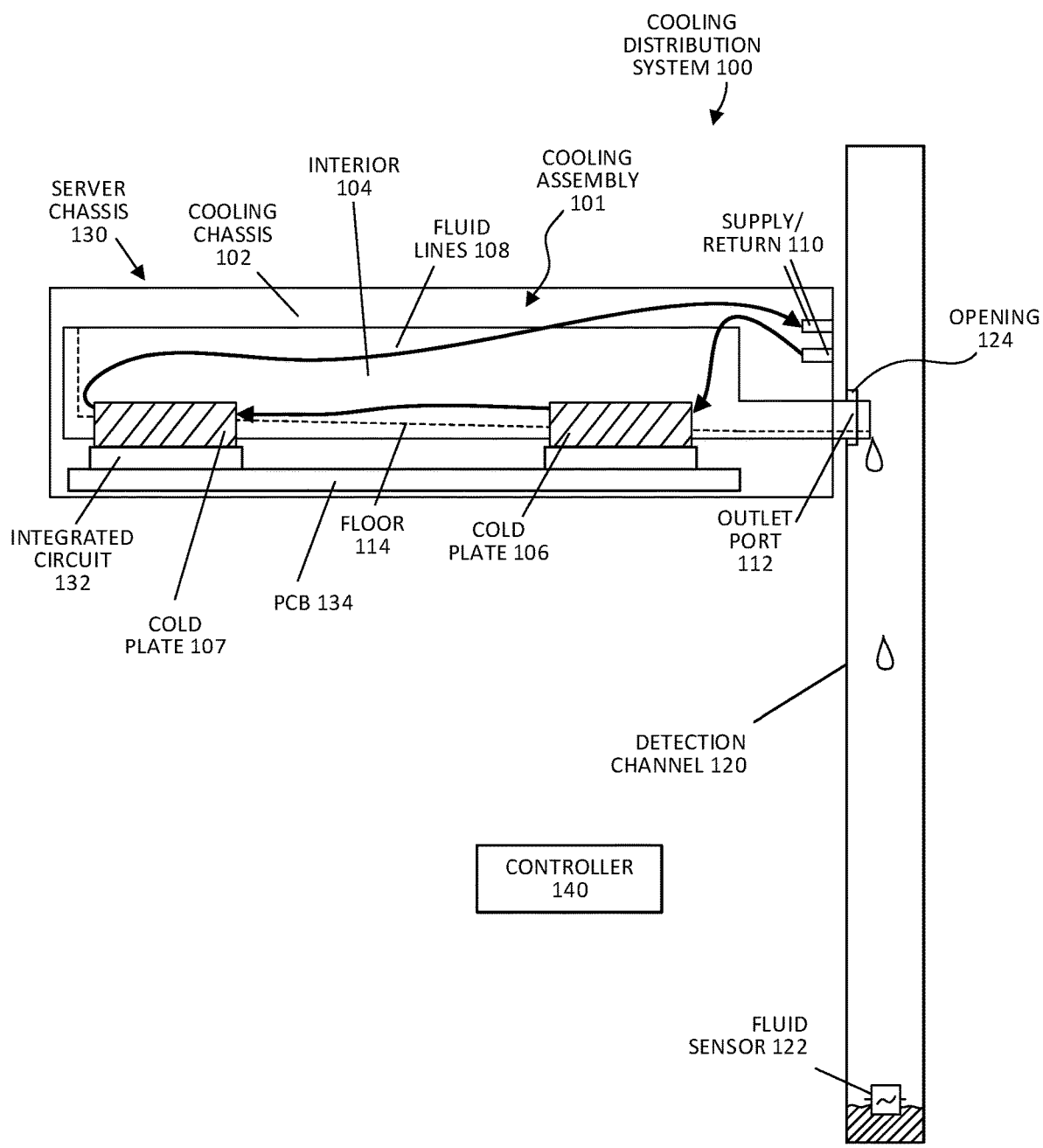
FIG. 1 shows a cooling system with a cooling assembly that directs leaked fluid into a detection channel, according to some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Liquid cooling systems can circulate fluid to and from IT electronics within an IT rack. Within an IT rack, leaks within the liquid cooling system can be common, due to the various conduits, connectors, fittings, adapters, cold plates, and other parts that the fluid travels through or interfaces with. Fluid can leak at different rates, depending on the severity of the leak. A cooling system for an IT rack can have a two-part hardware design that serves to isolate the electronics from the liquid cooling loops to segregate from potential lea ked fluid as well as gather the leaked fluid into a designated region for detection. Taken together, such a design can reduce the impact of a leak towards IT equipment and improve reliability. The current design is to propose a server and rack liquid cooling hardware system codesign. The system includes the hardware and system design on the rack, and hardware design within the server to enable a segregation of the electronics and liquid cooling hardware. This is to prevent any leaked fluid getting contact with any electronics.

Generally, a cooling system for an IT rack includes one or more cooling assemblies and a detection channel. Each of the cooling assemblies carry fluid to and from IT equipment (e.g., a server) for thermal energy transfer. In the case of a fluid leak, each of the cooling assemblies can isolate the leaked fluid from the IT equipment and divert it away to the detection channel.

A cooling assembly may include a cooling chassis that has an outlet port that provides a path for a leaked fluid to flow out of an interior of the cooling chassis and one or more cold plates located at or fixed to a bottom portion of the cooling chassis. Fluid lines may be arranged in the interior of the cooling chassis to fluidly connect the one or more cold plates to a supply line and a return line, which can be fluidly connected to a rack manifold.

A detection channel may have one or more leakage sensors within the detection channel, and one or more openings that receive the outlet port of each of the one or more cooling assemblies. In such a manner, the cooling assembly with cooling chassis can serve as a barrier that isolates potentially leaked fluid from IT equipment while simultaneously diverting the fluid to the detection channel to detect the leak. Small leaks may be difficult for sensors to detect. Sensors may not trigger unless submerged in at least a threshold amount of fluid. The hardware codesign is important for efficiently implementing the sensors as well as accurately detecting the leaks. Further, given the many potential points of leakage in an IT rack, it is impractical to place sensors at each potential point of failure. However, it may not be possible to implement sensor at all the possible locations, therefore, a hardware codesign for directing the leak fluid to the dedicated sensor location is useful. Thus, such a cooling system can aid in detection of leak while isolating the leaked fluid from the IT equipment.

FIG. 1 shows a cooling system 100 with a cooling assembly 101 that directs leaked fluid into a detection channel 120, according to some embodiments. The cooling assembly may be attached to a server chassis 130 that houses IT equipment such as a printed circuit board 134 and one or more integrated circuits 132.

The cooling assembly 101 includes a cooling chassis 102 having an outlet port 112 that provides a path for a leaked fluid to flow out of an interior 104 of the cooling chassis 102. The cooling assembly includes one or more cold plates shown as 106 and 107, located or fixed at a bottom portion of the cooling chassis. The cold plates can be secured to the cooling chassis in different manners. For example, each cold plate can sit in a cup within the server chassis, the cub being shaped to mate with the geometry of the cold plate. Alternatively, the cold plates can pass through openings of the cooling chassis and the cold plates and cooling chassis can be joined together in a fully sealed manner that does not allow liquid to pass. Alternatively, the cold plates can be formed as part of the cooling chassis, such as from a common monolithic material (e.g., a metal). Cold plates can be fixed to the server chassis with suitable hardware such as bolts, screws, snaps, clips, or through joining techniques such as pressing, soldering, and/or welding. Other techniques can also be implemented to provide a cooling chassis with one or more cold plates without departing from the scope of the present disclosure. Fluid lines 108 are arranged in the interior of the cooling chassis to fluidly connect the one or more cold plates 106 and 107 to a supply line and a return line shown collectively as 110. It should be understood that the fluid lines 108 can include a combination of connectors and conduit (e.g., rigid or flexible) that can mate with connectors on the cold plates. In one embodiment, the fluid connectors are dripless quick disconnectors. The supply line and return line can fluidly connect to fluid ports of a rack manifold, as described in other sections.

The detection channel 120 has one or more fluid sensors 122 within the detection channel, and an opening 124 that receives the outlet port 112 of the cooling chassis. Fluid sensors 122 can be located at a bottom fluid collection region within the detection channel to detect fluid that is pooled there. This bottom region can be fully sealed to prevent fluid from escaping the detection channel. The detection channel in the current design can be understood as a fluid collection unit that serves to decrease the impact of the leaked fluid to prevent fluid approaching other areas while also enabling a more efficient manner to implement a leak detection sensor and more accurate leak detection.

The fluid sensors 122 can include a fluid sensing cable or spot detectors that detect fluid based on electricity—when a fluid makes contact with two electric potentials, then the fluid conducts electricity which causes current to flow through the sensor, which indicates presence of a fluid. These can be understood as conductive sensors. Additionally, or alternatively, fluid sensors 122 can include optical sensors, capacitive sensors, a diaphragm, a float device, or other fluid sensing technology.

A controller 140 can be communicatively coupled to the one or more fluid sensors 122 to monitor whether a leak is present. In some aspects, in response to a detected leak, the controller can perform a shutdown of IT equipment, for example, by communicating to the IT equipment to perform a software shutdown. Additionally, or alternatively, the controller can shut off electric power to the IT equipment in response to a detected leak. The controller can also reallocate operations of IT equipment in a leaking IT rack to IT equipment in another IT rack that is not leaking fluid.

In some embodiments, the controller can reduce a flow of the fluid into the fluid manifold, in response to the fluid in the container being detected. For example, the controller can shut off a pump that pumps fluid into a manifold of an IT rack, or close main valve that cuts off fluid flow to the IT equipment. Thus, the fluid within the cooling distribution system can be slowly emptied, to allow the IT equipment to shutdown gracefully. The controller can initiate shutdown of one or more of the electronic components in the IT rack through one or more commands and/or by cutting power to them.

The one or more sensors, pumps, or valves can be hardwired to the controller (e.g., through digital or analog I/O), and/or communicate with the controller through wireless communications. Operations, methods, and processes performed by processing logic of the controller, which can comprise hardware (e.g. circuitry, dedicated logic, etc.), software (e.g., embodied on a non-transitory computer readable medium), or a combination of both. The controller can include a single computing device, or an aggregate of multiple devices that perform operations distributed between the multiple devices.

For example, the controller can include a processor and computer-readable memory that stores instructions for the controller to execute. Additionally, or alternatively, the controller can include one or more electronic circuits that contain processing logic that monitors whether a leak is present. In some embodiments, the controller can include programmable logic such as FPGAs or CPLDs. The one or more fluid sensors can have leads that connect to analog or digital inputs of the controller 140. Additionally, or alternatively, the one or more fluid sensors can communicate to controller 140 over a communication bus (e.g., RS232, CAN, etc.).

The cooling assembly 101 may be attached to the server chassis 130 and each of the one or more cold plates (e.g., cold plates 106 and 107) may be attached to a surface of an integrated circuit 132 of IT equipment housed in the server chassis. The integrated circuit can be a surface mountable device (SMD) which can also be referred to as a 'chip' that mounts on a printed circuit board (PCB) 134. The integrated circuit can include one or more heat generating components such as, for example, a high-powered processor or acceleration device of a server.

A cold plate can include fluid lines that are thermally coupled to a heat conductive plate. For example, fluid lines can be machined within or fixed to a side of a thermally conductive plate which can be, for example, a metal plate). The fluid lines of a cold plate can have a meandering or repeating back and forth path to lengthen the flow of fluid evenly across a cold plate. Typically, fluid flows through the lines to absorb thermal energy from the thermally conductive plate, however, cold plates can also transfer thermal energy from the fluid to a component. The thermally conductive plate can have a flat surface that physically and thermally connects to a flat surface of an electronic component such as the integrated circuit. The fluid can include a liquid coolant such as water, propylene glycol, or other liquid coolant technology. The fluid can be a single-phase liquid coolant. The fluid can be a two-phase coolant.

The cooling chassis 102 may include a sloped, curved, and/or stepped floor 114 within the interior 104 of the cooling chassis. In such a manner, the floor can direct the leaked fluid to flow towards the outlet port 112. This is illustrated, for example, in FIG. 4A. Various floor designs can be implemented to use gravity to direct the flow of leaked fluid towards the outlet port.

In such a manner, should a fluid leak occur from the cold plates or the fluid lines that are connected to the cold plates, the cooling chassis will capture this fluid and keep it away from the ICs and the PCB. This fluid is directed to the detection channel where the leaked fluid can be detected. The fluid is fully contained in the cooling system, including the fluid leaking out of the loop in a failure incident.

Figure 2:
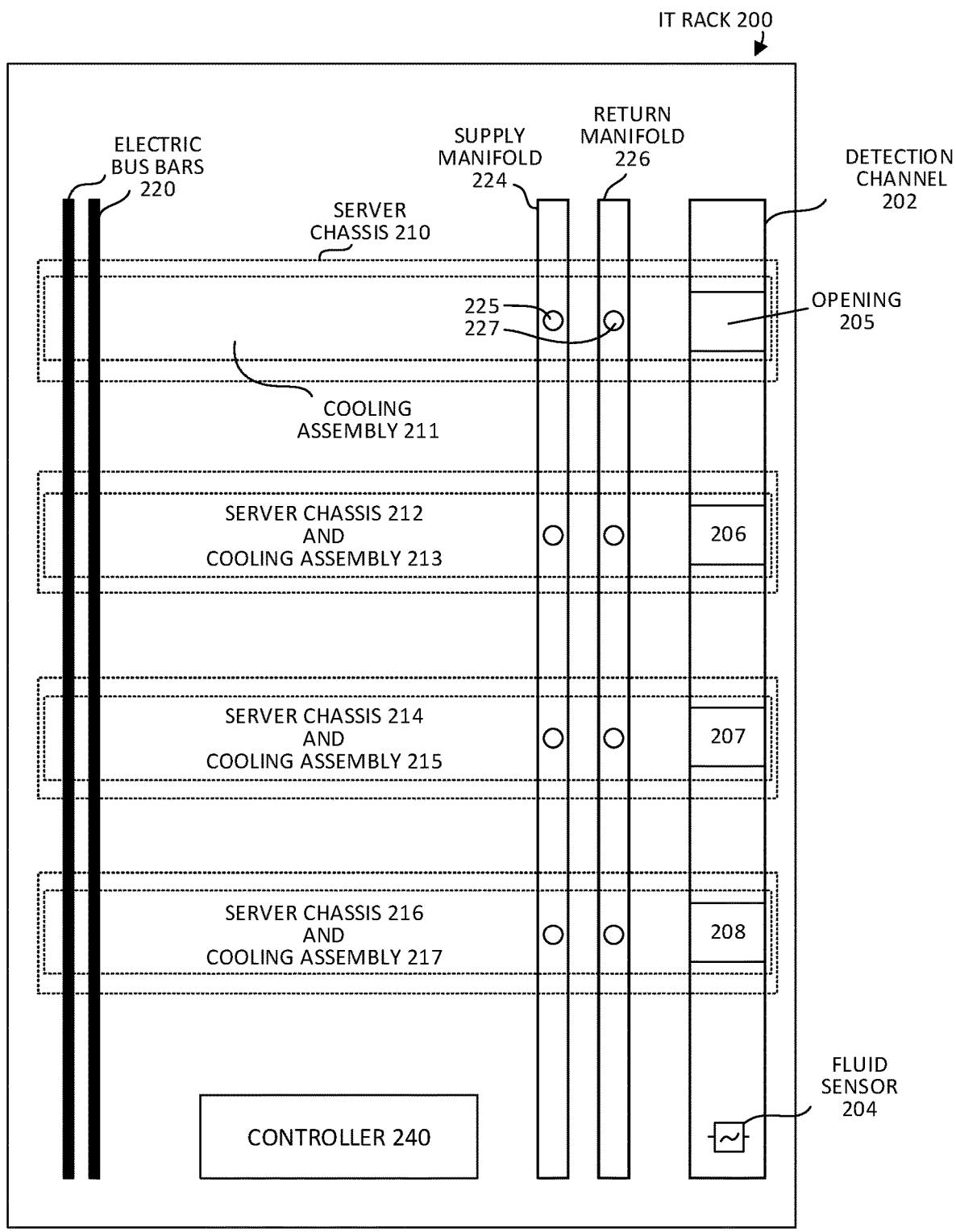
FIG. 2 shows an example of an IT rack with leak detection and protection, according to some embodiments.

FIG. 2 shows an example of an IT rack with leak detection and protection, according to some embodiments. In this example, a back view of the IT rack is shown, however, this could also be a front view or side view, depending on the design of the IT rack. Aspects described can apply to different IT rack designs.

The IT rack can include electric bus bars 220 which can deliver electricity to IT equipment that is housed in one or more server chassis such as server chassis 210, 212, 214, and 216. Each server chassis can have a respective cooling assembly 211, 213, 215, and 217. Each cooling assembly can have a fluid line that connects to a fluid supply manifold 224 and a second fluid line that connects to a fluid return manifold 226. The supply manifold and return manifold can be understood collectively as a fluid manifold. The fluid supply manifold 224 can receive fluid from an external fluid supply source and supply the fluid to IT equipment in an IT rack. The fluid flows through each cooling assembly and then flows back to the return manifold. The return manifold receives the fluid from the IT equipment and returns that fluid to an external liquid source. As such, the manifold serves as a central distribution structure that circulates fluid to and from the IT equipment in the IT rack. This fluid can be referred to as IT rack level fluid. In some embodiments, the IT rack level fluid can be fluidly isolated from an external fluid, but thermally connected to it (e.g., via a heat exchanger).

Thermal energy can be transferred away from IT equipment as the fluid circulates through thermally conductive parts such as cold plates that are also thermally connected to the IT equipment. As mentioned, however, leaks can spring along the path of the fluid. In particular, fluid lines that carry fluid to and from the cold plates of the cooling assembly can have numerous transitions and connection points, thus presenting numerous points of failure. It is appreciated that failures typically do not result in the escaped fluid projecting outward from openings in an explosive manner. Rather, failures tend to manifest with fluid leaking, dripping, and/or traveling on a structure guided by gravity. As such, the cooling assemblies can catch leaked fluid and direct the flow of this leaked fluid to detection channel 202.

As shown, the detection channel may include a plurality of openings, each of the plurality of openings receiving one of a plurality of outlet ports of a respective cooling assembly. For example, cooling assembly 211 can have a cooling chassis with an outlet port that is inserted in opening 205. Similarly, cooling assembly 213 can have its own cooling chassis with its own outlet port that is inserted in opening 206, and so on.

In some embodiments, the detection channel 202 is arranged vertically a long the IT rack. For example, the detection channel can have a long unimpeded path with the length of the path traveling vertically in the IT rack. One or more fluid sensors 204 may be arranged at a bottom region of the detection channel. As such, leaked fluid that pools in the detection channel can trigger the fluid sensors and remedial measures can be taken by controller 240, such as shutdown of electronics, shutting the fluid flow, and/or transferring operations to another IT rack. For example, controller 240 can control a pump or valve (which is not shown) to reduce or stop fluid flow into the IT rack in response to a detected leak. Further, the controller can communicate with IT equipment to initiate a software shutdown and/or cut the electric power to the bus bars 220 (e.g., by controlling a contactor). Thus, leak detection and remedial action can be implemented individually for each IT rack, without affecting the fluid supply to remaining IT racks in the cluster.

Each server chassis can connect to fluid ports 225, 227 on the manifold. The fluid ports 225 and 227 can be understood as fluid connectors, such as manual mating dripless connectors, blind mating dripless connectors, or other connectors. Each server chassis can connect to each fluid port of with corresponding mating connectors. Although not shown, the manifold can be received from and returned to an external fluid ecosystem that can include a chiller, refrigeration, a fan, and/or other cooling techniques. Similarly, although not shown, each of the fluid lines may have connectors that mate with connectors of each cold plate. The fluid lines can be rigid or flexible, and can be made of metal, plastic, or other suitable materials.

In some embodiments, the electric bus bars run vertically along a first side of the IT rack, and the detection channel runs vertically along a second side that is opposite or away from the first side. As such, each cooling assembly may divert leaked fluid away from the electric bus bars towards the detection channel. It should be understood that, although shown with four server chassis, the number of server chassis in an IT rack can vary without departing from the scope of the disclosure.

Figure 3:
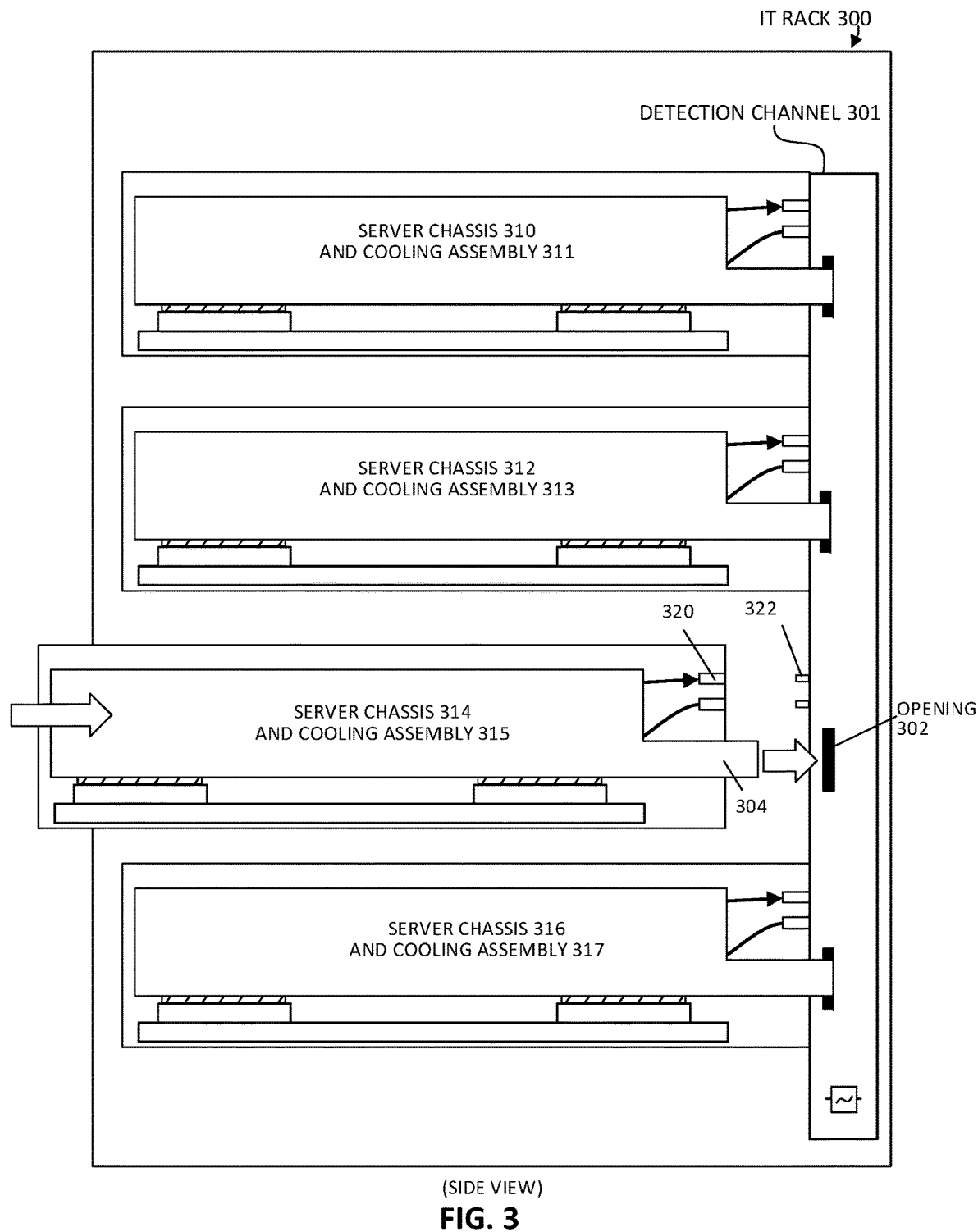
FIG. 3 shows an example installation of an IT rack with leak detection and protection, according to some embodiments.

FIG. 3 shows an example installation of an IT rack 300 with leak detection and protection, according to some embodiments. This can be understood as a side view of an IT rack, such as, for example, the IT rack shown in FIG. 2. IT rack 300 can include IT equipment that is housed in each of server chassis 310, 312, 314, and 316. Each server chassis can include a respective cooling assembly such as cooling assemblies 311, 313, 315, and 317, that each include cold plates housed in a cooling chassis, as described in other sections.

IT rack 300 includes a detection channel 301 with one or more openings into which an outlet port of a respective cooling chassis is inserted into and resides in. Installation of the server chassis to the IT rack can include insertion of the server chassis into a slot of the IT rack. Upon insertion, the outlet port of cooling assembly may enter the opening of the detection channel.

For example, when server chassis 314 is pushed into the slot of the IT rack, outlet port 304 of cooling assembly 315 may be guided into opening 302. In addition, the fluid lines of the cooling assembly 315 can be fluidly connected to connectors 320 which can be mounted to the server chassis 314. When pushed into place, these connectors can mate with fluid port connectors 322 of a fluid manifold. For example, a first of connectors 320 may mate with a first of the fluid port connectors 322 on a supply manifold. A second of connectors 320 may mate with a second of the fluid port connectors 322 on a ret urn manifold. As such, installation of each server chassis can be performed with a push, without requiring manual twisting or turning of connectors. As mentioned, the fluid connectors can include manual mating dripless connectors, blind mating dripless connectors, or other connectors. The IT rack may include rails, grooves, guide pins, and/or other hardware that guides server chassis 314 into alignment with the opening and the connectors.

Figure 4A:
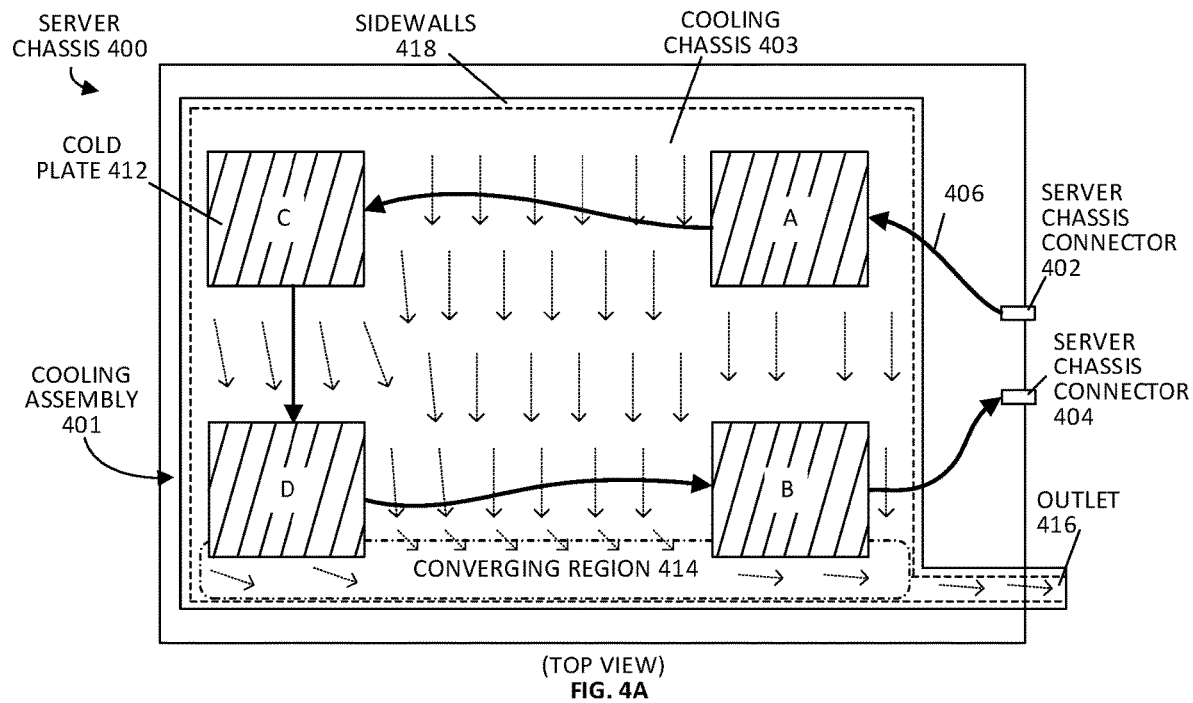
FIGS. 4A, 4B, and 4C show an example server chassis with cooling assembly, according to some embodiments.
Figure 4B:
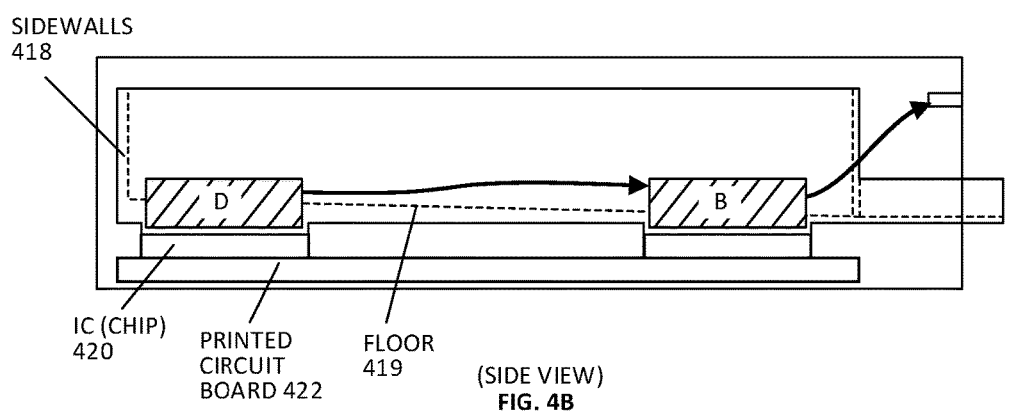
Figure 4C:
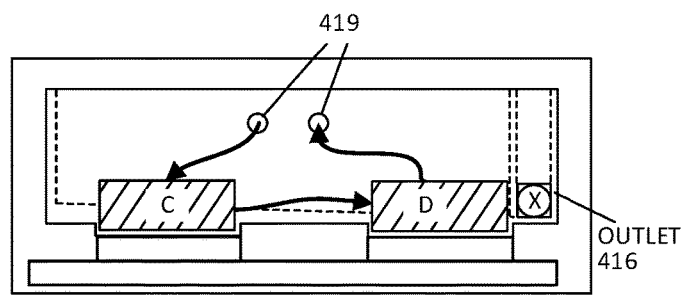

FIGS. 4A, 4B, and 4C show an example server chassis with cooling assembly, according to some embodiments. A server chassis can have IT equipment such as a PCB 422 with one or more ICs 420. A cooling assembly 401 may be installed to the server chassis with standard hardware such as brackets, bolts, clips, springs, standoffs, and other hardware. The cooling assembly can include one or more cold plates 412 which are shown here as cold plate A, B, C and D. Each of the cold plates as well as the fluid lines 406 that carry fluid to and from the cold plates, may be contained within the interior of the cooling chassis 403.

The cooling chassis may include a plurality of sidewalls 418 that enclose the interior of the cooling chassis, at least from the sides. The cooling chassis may be open at a top surface of the cooling chassis, forming a tray shape with an outlet port 416. Such a shape can effectively catch leaked fluid while allowing for simple assembly and maintenance of the cold plates and fluid lines, while also reducing an overall weight of the overall cooling assembly. The cooling chassis as described in different embodiments can be formed from a sheet metal.

As mentioned, the floor 419 of the cooling chassis can be sloped, curved, grooved and/or stepped to direct the flow of leaked fluid within the cooling chassis towards the outlet port 416. In some embodiments, the cooling chassis includes a converging region 414 into which the floor directs the leaked fluid. From the converging region, the floor of the cooling chassis can further direct the leaked fluid to the outlet port. Fluid lines 406 can connect to server chassis connectors 402, 404, which can connect to fluid ports on a manifold, as described in other sections. The server chassis connectors and outlet 416 can face a common direction so that the server chassis can be installed by pushing the server chassis connectors into the fluid ports of the manifold while simultaneously pushing the outlet port into an opening of a detection channel.

In some embodiments, the fluid lines are installed from the server chassis connectors directly to the cold plates through an open top of the cooling chassis 403, so that ports 419 may not be present on the cooling chassis. In some embodiments, the cooling chassis can include one or more optional ports 419 through which the fluid lines can pass. These ports can also be fluid connectors.

Figure 5:
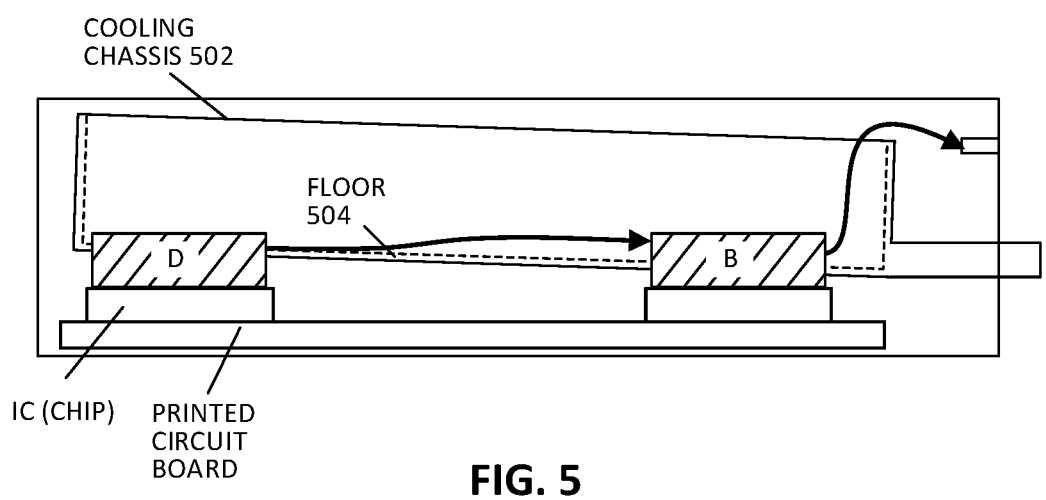
FIG. 5 shows an example server chassis with cooling assembly, according to some embodiments.

FIG. 5 shows an example server chassis with cooling assembly, according to some embodiments. In this example, cooling chassis 502 can be installed on the server chassis and relative to the flat surface of the cold plates. This tilt can provide a sloped floor 504 to direct leaked fluid out of the fluid port. The cooling chassis can have a rectangular box shape with sidewalls and floor joining at right angles, but with the cold plates joined to the cooling chassis at angles such that they mate flush with the IT equipment when installed in the server chassis.

Figure 7:
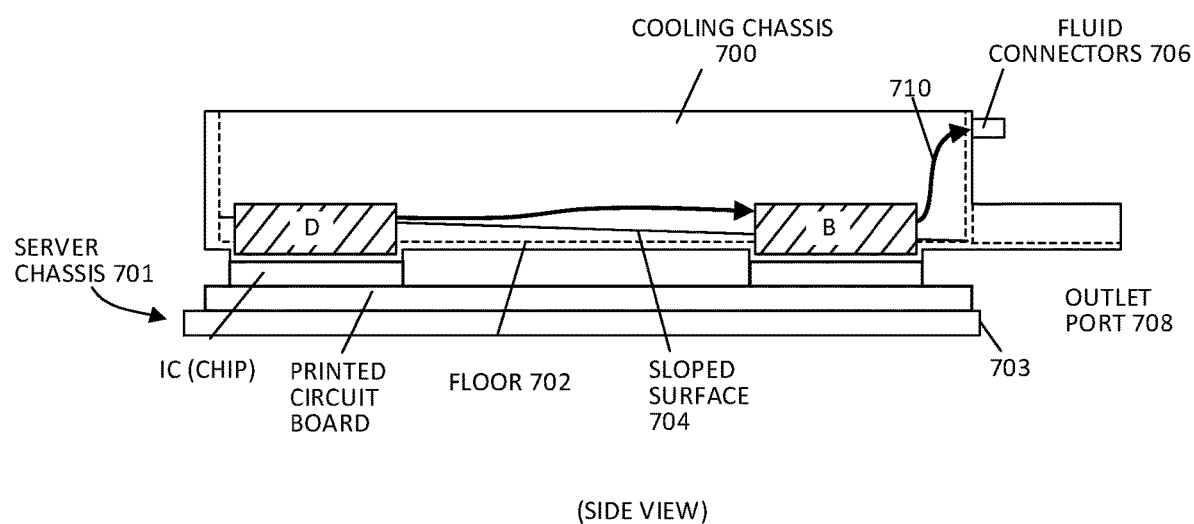
FIG. 7 shows an example server chassis with cooling assembly, according to some embodiments.

In some embodiments, such as in FIG. 7, the fluid connectors 706 that fluidly connect from the server chassis 701 to the manifold ports for circulating fluid are fixed at a location on the cooling chassis. The fluid connectors can be located adjacent to and/or on the same side of the cooling chassis as where the outlet port 708 is located. In such a manner, installation of the server chassis can be performed with a push. Fluid lines 710 can fluidly connect the cold plates to the fluid connectors 706. The fluid connectors 706 can include a first connector that mates with a supply manifold port, and a second connector that mates with a return manifold port. The fluid connectors 706 and the outlet port 708 can extend over and past the leading edge 703 of a mounting frame of the server chassis 701.

In some embodiments, such as in FIGS. 4A, 4B, and 4C, the floor 419 of the cooling chassis can have a non-uniform thickness to create a sloped, stepped, grooved, and/or curved floor that directs the leaked fluid toward the outlet 416. For example, the floor can be thicker away from the outlet become thinner towards the outlet so that, when installed in the server chassis and IT rack, the cooling chassis floor in the interior region of the cooling chassis is higher away from the outlet and lower as it gets closer to the outlet. In some embodiments, the floor can have uniform thickness, but can be joined to the side walls at an angle and/or be bent to form a sloped, stepped, grooved, and/or curved floor. In some embodiments, such as in FIG. 7, the cooling chassis includes a sloped surface 704, that is attached to the interior of the cooling chassis above a floor 702 of the cooling chassis which can be flat. The sloped surface serves as a raised floor to guide the flow of the leaked fluid. As mentioned, various designs can be implemented to provide a floor that is to assist fluid flow to the converging region and to the detection channel of the cooling chassis. It should be understood that features shown in one some figures can be combined with features shown in other figures. For example, the connectors shown attached to the cooling chassis in FIG. 7 may also be combined with some of the features discussed relative to the cooling assembly and server chassis shown in other figures.

Figure 6:
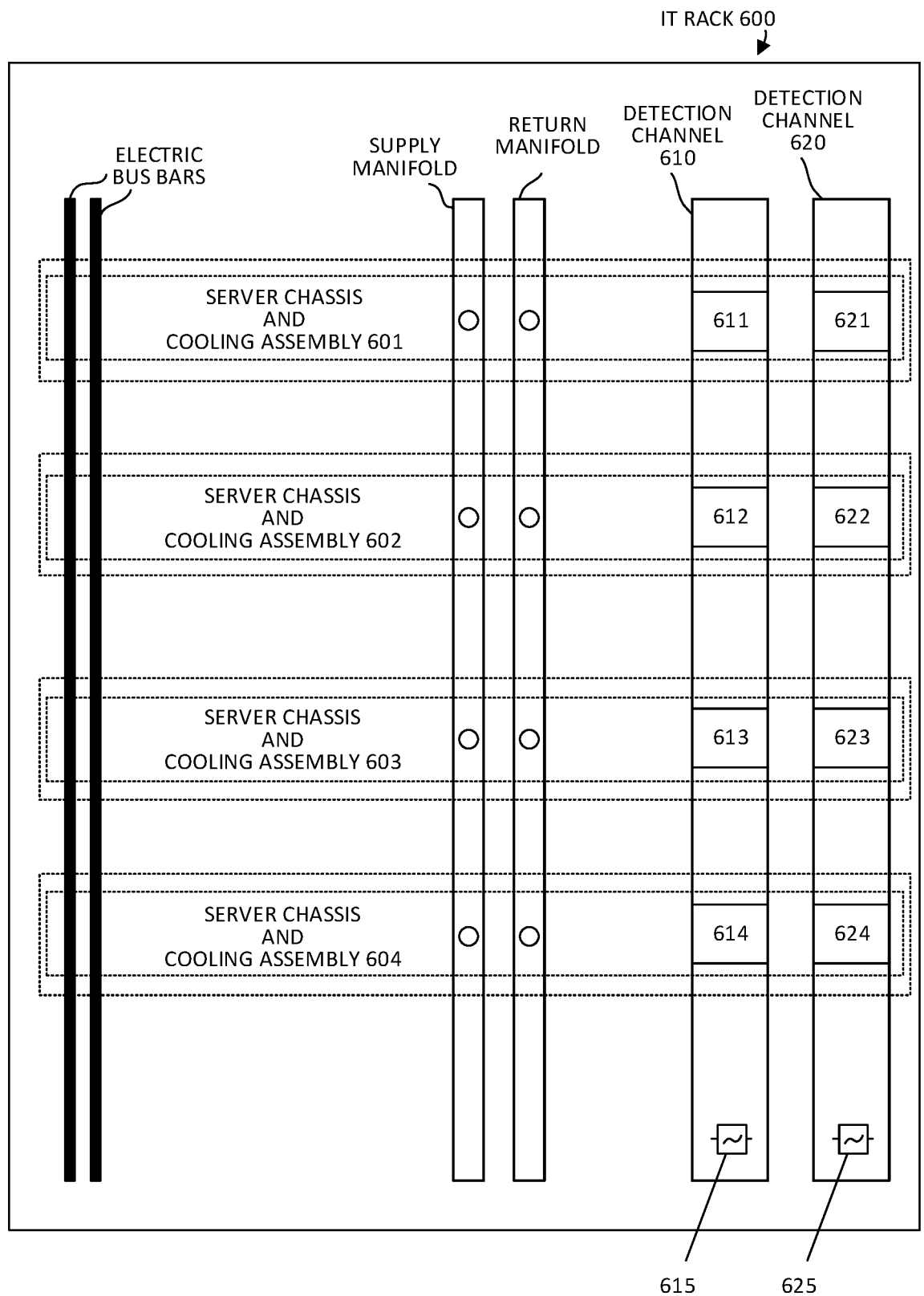
FIG. 6 shows an IT rack with cooling assembly having a plurality of detection channels, according to some embodiments.

FIG. 6 shows an IT rack 600 with cooling assembly having a plurality of detection channels, according to some embodiments. IT rack 600 can include a detection channel 610 and one or more additional detection channels 620, each having one or more respective fluid sensors 615 and 625, and a respective opening that receives an additional outlet port of the cooling assembly or an outlet port of a different cooling assembly.

For example, detection channel 610 can include openings 611, 612, 613, and 614 that each receive an outlet port of some of cooling assemblies 601, 602, 603, and 604. Similarly, detection channel 620 can include openings 621, 622, 623, and 623 that receive an outlet port of some of cooling assemblies 601, 602, 603, and 604. For example, cooling assemblies 601 can have an outlet port that resides in opening 611, while cooling assembly 602 can have an outlet port that resides in opening 622. As such, server chassis can be grouped into different detection channels. This can help a controller narrow down which of the server chassis has a fluid leak. A controller can generate a notification or an error log that can be accessed electronically to perform maintenance or trouble shooting. In some examples, a cooling assembly can have more than one outlet port. For example, on a large IT rack, the cooling assembly may divert the leaked fluid to separate outlet ports. In such an example, cooling assembly 601 can have two outlet ports, a first outlet port that is inserted into opening 611 and a second outlet port that is inserted into opening 621. In one embodiment, cooling assemblies 601 and 602 may each have an outlet port that is inserted in openings 621 and 622 respectively, and cooling assemblies 603 and 604 may each have an outlet port that is inserted in openings 613 and 614, respectively.

Although not shown, an IT rack can, in some embodiments, include various other supporting components. For example, an IT rack can include a cooling distribution unit (CDU), a rack management unit (RMU). The server chassis can also be referred to as a server blade that can be inserted into an array of server slots respectively from frontend or backend of the IT rack. An IT rack can be either open to the environment or partially contained by a rack container. The IT rack can include one or more cooling fans that can generate airflow from a frontend to a backend of the IT rack. In some embodiments, an IT rack may include a cooling fan for each server chassis. The cooling fans may be mounted on each server chassis to generate airflow through the server chassis. In some embodiments, the CDU can include a heat exchanger, liquid pump, a pump controller, a fluid reservoir, a power supply, sensors and more. The CDU's heat exchanger may be a liquid-to-liquid heat exchanger that includes a first loop with inlet and outlet ports having a first pair of liquid connectors coupled to external liquid supply/return lines to form a primary loop. The liquid supply/return lines may be fluidly connected to a set of room manifolds, which may be coupled to an external heat removal system, or external cooling loop. In addition, the heat exchanger may further include a second loop with two ports having a second pair of liquid connectors coupled to the fluid manifold to form a secondary loop that fluidly supplies and returns fluid between one or more server chassis and the CDU.

Each of the server chassis may house one or more servers which may include one or more components such as, for example, central processing units or CPUs, graphical processing units (GPUs), memory, and/or storage devices. Each component may perform data processing tasks, where the component may include software installed in a storage device, loaded into the memory, and executed by one or more processors to perform the data processing tasks. At least some of these components may be attached to the bottom of any of the cold plates as described above. A server may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

An IT rack may further include an optional RMU configured to provide and manage power supplied to servers, fan modules, and the CDU. The RMU may be coupled to a power supply unit to manage the power consumption of the power supply unit. The power supply unit may include the necessary circuitry (e.g., an alternating current (AC) to direct current (DC) or DC to DC power converter, backup battery, transformer, or regulator, etc.,) to provide power to the rest of the components of the IT rack.

Aspects of the cooling distribution system can be flexible and deployable in different system architectures; for example, the system can be deployed with a localized pumping system (e.g., a closed system architecture) or central pumping system (e.g., an open system architecture). Aspects described can simultaneously separate IT equipment from leaked fluid and direct leaked fluid to pool in a common location for detection, thereby minimizing the impact of a fluid leak and increasing overall system reliability.

Some embodiments may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling system for an information technology (IT) rack, comprising:
    a cooling assembly including
        a cooling chassis having an outlet port that provides a path for a leaked fluid to flow out of an interior of the cooling chassis, and
        one or more cold plates located at a bottom portion of the cooling chassis, wherein fluid lines are arranged in the interior of the cooling chassis to fluidly connect the one or more cold plates to a supply line and a return line; and
    a detection channel having one or more fluid sensors within the detection channel, and an opening that receives the outlet port of the cooling chassis to receive the leaked fluid to detect any fluid leaked from the cooling assembly, wherein the outlet port inserts into and resides in the opening of the detection channel.

2. The cooling system of claim 1, wherein the cooling assembly is attached to a server chassis and each of the one or more cold plates is attached to a surface of an integrated circuit of IT equipment housed in the server chassis.

3. The cooling system of claim 1, wherein installation of the server chassis to the IT rack includes insertion of the server chassis into a slot of the IT rack, and the outlet port enters the opening of the detection channel upon the insertion of the server chassis into the slot of the IT rack.

4. The cooling system of claim 1, wherein the cooling chassis includes a sloped, curved, or stepped floor within the interior of the cooling chassis that is to direct the leaked fluid to flow towards the outlet port.

5. The cooling system of claim 1, wherein the detection channel is arranged vertically along the IT rack.

6. The cooling system of claim 5, wherein the one or more fluid sensors are located at a bottom fluid collection region within the detection channel.

7. The cooling system of claim 1, wherein the detection channel includes a plurality of openings, each of the plurality of openings receiving one of a plurality of outlet ports of a respective cooling assembly.

8. The cooling system of claim 1, wherein the cooling chassis includes a plurality of sidewalls that enclose the interior of the cooling chassis.

9. The cooling system of claim 1, wherein the cooling chassis includes a sloped surface that is attached to the interior of the cooling chassis above a floor of the cooling chassis.

10. The cooling system of claim 1, comprising one or more additional detection channels, each having one or more respective fluid sensors, and at least one opening that receives an additional outlet port of the cooling chassis or an outlet port of a second cooling assembly.

11. An information technology (IT) rack, comprising:
    IT equipment;
    a cooling assembly including
        a cooling chassis having an outlet port that provides a path for a leaked fluid to flow out of an interior of the cooling chassis, and
        one or more cold plates located at a bottom portion of the cooling chassis, wherein fluid lines are arranged in the interior of the cooling chassis to fluidly connect the one or more cold plates to a supply line and a return line; and
    a detection channel having one or more fluid sensors within the detection channel, and an opening that receives the outlet port of the cooling chassis to receive the leaked fluid to detect any fluid leaked from the cooling assembly, wherein the outlet port inserts into and resides in the opening of the detection channel.

12. The IT rack of claim 11, wherein the cooling assembly is attached to a server chassis and each of the one or more cold plates is attached to a surface of an integrated circuit of the IT equipment housed in the server chassis.

13. The IT rack of claim 11, wherein installation of the server chassis to the IT rack includes insertion of the server chassis into a slot of the IT rack, and the outlet port enters the opening of the detection channel upon the insertion of the server chassis into the slot of the IT rack.

14. The IT rack of claim 11, wherein the cooling chassis includes a sloped, curved, or stepped floor within the interior of the cooling chassis that is to direct the leaked fluid to flow towards the outlet port.

15. The IT rack of claim 11, wherein the detection channel is arranged vertically along the IT rack.

16. The IT rack of claim 15, wherein the one or more fluid sensors are located at a bottom fluid collection region within the detection channel.

17. The IT rack of claim 11, wherein the detection channel includes a plurality of openings, each of the plurality of openings receiving one of a plurality of outlet ports of a respective cooling assembly.

18. The IT rack of claim 11, wherein the cooling chassis includes a plurality of sidewalls that enclose the interior of the cooling chassis.

19. The IT rack of claim 11, wherein the cooling chassis includes fluid connectors that are fluidly connected to the fluid lines, the fluid connectors being located on the cooling chassis adjacent to the outlet port.

20. A data center comprising:
    a plurality of Information Technology (IT) racks, one or more of the IT racks including:
        IT equipment;
        a cooling assembly including
            a cooling chassis having an outlet port that provides a path for a leaked fluid to flow out of an interior of the cooling chassis, and
            one or more cold plates located at a bottom portion of the cooling chassis, wherein fluid lines are arranged in the interior of the cooling chassis to fluidly connect the one or more cold plates to a supply line and a return line; and
        a detection channel having one or more fluid sensors within the detection channel, and an opening that receives the outlet port of the cooling chassis to receive the leaked fluid to detect any fluid leaked from the cooling assembly, wherein the outlet port inserts into and resides in the opening of the detection channel.

* * * * *